United States Patent

Pritchard et al.

[15] 3,662,274

[45] May 9, 1972

[54] DUAL-CHANNEL LOGARITHMIC AMPLIFIER

[72] Inventors: Donald A. Pritchard, Orange; Aldan Duane Gomez, San Diego, both of Calif.

[73] Assignee: Ametek, Inc., New York, N.Y.

[22] Filed: June 8, 1970

[21] Appl. No.: 48,799

Related U.S. Application Data

[63] Continuation of Ser. No. 735,224, June 7, 1968.

[52] U.S. Cl. ..............................329/192, 328/145, 328/167, 330/30, 330/126, 330/136, 330/149, 330/151

[51] Int. Cl. ..........................................................H03d 1/14

[58] Field of Search....................330/30, 126, 132, 136, 151, 330/149; 328/145, 167; 325/475, 477, 479; 329/192

[56] References Cited

UNITED STATES PATENTS 3,182,135 5/1965 Siezen...............................330/136 X

*Primary Examiner*—Roy Lake
*Assistant Examiner*—James B. Mullins
*Attorney*—Strauch, Nolan, Neale, Nies & Kurz

[57] ABSTRACT

A dual-channel logarithmic amplifier for amplifying and detecting frequency components of an input signal comprising a plurality of frequency components and particularly for amplifying and detecting desired frequency components in the presence of high level, wide band noise. The inventive apparatus comprises a first amplifier means responsive only to a relatively narrow band of the frequency components comprising the input signal for amplifying desired frequency components in the narrow band and producing an output signal. Second amplifier means are provided responsive to a relatively wide band of the frequency components comprising the input signal including high level, wide band noise adjacent to the desired frequency components for amplifying the same. Negative feedback means are connected from the second amplifier means to the first amplifier means so as to reduce the input gain of the first amplifier means in response to the output from the second amplifier means. In this manner, the detection and amplification of small amplitude desired frequency components is made possible even in the presence of high level, wide band noise.

20 Claims, 9 Drawing Figures

Figure 1A:
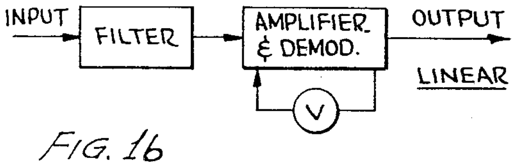

INVENTORS,
DONALD A. PRITCHARD
ALDAN DUANE GOMEZ
BY
Strauch Nolan Neale Nies + Kurz
ATTORNEYS

INVENTORS,
DONALD A. PRITCHARD
ALDAN DUANE GOMEZ

BY Strauch, Nolan, Neale, Nies & Kurz
ATTORNEYS

DUAL-CHANNEL LOGARITHMIC AMPLIFIER

This application is a continuation of application Serial No. 735,224 filed on June 7, 1968 for Dual-Channel Logarithmic Amplifier.

This invention generally relates to amplifiers and particularly concerns an amplifier arrangement which can amplify and detect desired low amplitude frequency components of an input signal comprising high level wide band noise adjacent the desired frequency components.

In many electronic areas and applications, it is desirable to monitor, detect and amplify only selected or desired frequency components of an input signal which may comprise a plurality of frequency components. One such area in which this operational mode is a necessity is the field of so-called "continuous transmission" FM sonar. With "continuous transmission" FM sonar, a signal is provided substantially at all times which may comprise a plurality of frequency components of varying amplitudes, only selected or desired frequency components of the signal being of interest. These selected or desired frequency components represent information concerning a monitored target such as the distance of the target and the target size. Frequently, however, the desired or selected information frequency components are of such small magnitude compared with the frequency components such as high level, wide band noise adjacent thereto, that the detection of the same is rendered exceedingly difficult.

Attempts at detection and amplification of these selected or desired frequency components in the presence of high level, wide band noise have been made utilizing a linear amplifier which is responsive only to a narrow band of the frequency components of the input signal, the narrow band including the desired frequency components of interest. Yet, it has been found that the selected frequency components, due to the small amplitude thereof, were oftentimes obliterated by the presence of the high level, wide band noise signal adjacent thereto since the high level, wide band noise would saturate and overload the linear amplifier. Even when the amplifier utilized has a simple logarithmic gain, the same problem existed since the magnitude of the high level noise adjacent the small level selected frequency components was such that saturation of the amplifier would still occur.

Thus, these prior amplification techniques are quite ineffective when it is necessary to detect and amplify selected or desired small level frequency components of an input signal comprising a plurality of frequency components, such input signal including high level, wide band noise adjacent the selected or desired frequency components. It is a primary object of the subject invention to overcome the difficulties associated with the prior techniques and to provide an amplification arrangement which can effectively detect and amplify these small level selected frequency components even in the presence of high level, wide band noise.

It is a further and more specific object of the subject invention to provide an amplification arrangement which prevents saturation and overloading of an amplifier device when high level, wide band noise is applied to the input thereof, such saturation and overloading making the detection and amplification or small magnitude selected frequency components of the input signal exceedingly difficult.

A still further object of the subject invention is to provide an amplification arrangement offering the operational features discussed above, yet comprising a relatively simple and economical structure.

These and other objects of the subject invention are implemented by the disclosed novel amplification apparatus, which, in a preferred form thereof, comprises a first amplifier means adapted to respond to only a relatively narrow frequency band of an input signal having a plurality of frequency components including high level, wide band noise. The relatively narrow frequency band includes desired or selected frequency components of interest within or adjacent to portions of the high level, wide band noise. The first amplifier means is preferably constructed to have a non-linear or substantially logarithmic gain so that relatively high level components are compressed at the output.

A second amplifier means is provided, the second amplifier means being responsive to a relatively wide frequency band of the plurality of frequency components comprising the input signal, the relatively wide band width of the second amplifier means having substantially the same center frequency as the relatively narrow band width of the first amplifier means. The second amplifier means accordingly serves to examine the spectral content and magnitude of those frequency components of the input signal adjacent to the desired or selected frequency components. Specifically, the second amplifier means is responsive to the high level, wide band noise adjacent to the desired or selected frequency components of interest.

Negative feedback means are connected from the second amplifier means to the first amplifier means which serves to reduce the input gain of the first or narrow band amplifier means in response to the output of the second or wide band amplifier means. In this manner, small amplitude desired or selected frequency components of the input signal can be suitably detected and amplified by the first amplifier means, since saturation or overloading of the first amplifier means by the high level, wide band noise adjacent to the desired or selected frequency components is prevented by the action of the second amplifier means and the negative feedback means.

Figure 1B:
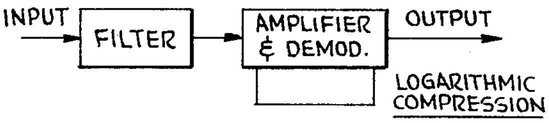
Figure 1C:
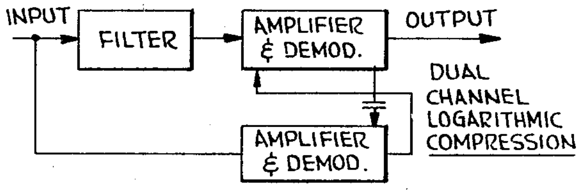
Figure 3A:
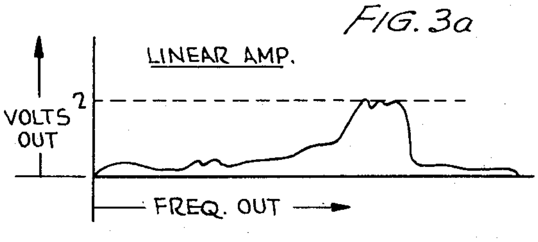
Figure 3B:
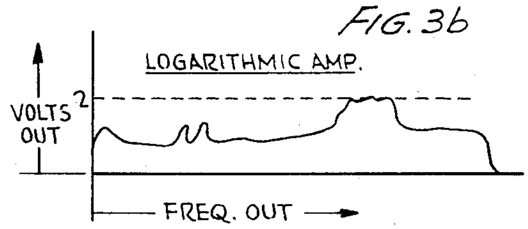
Figure 3C:
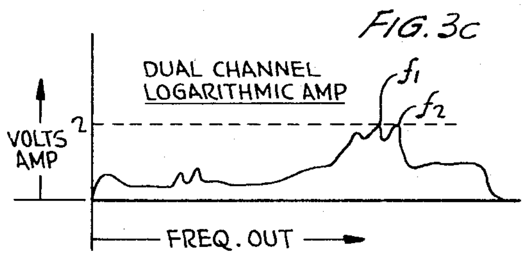
Figure 2:
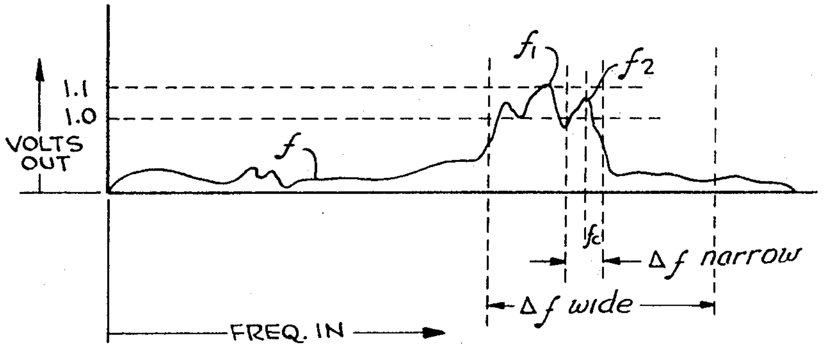
Figure 4:
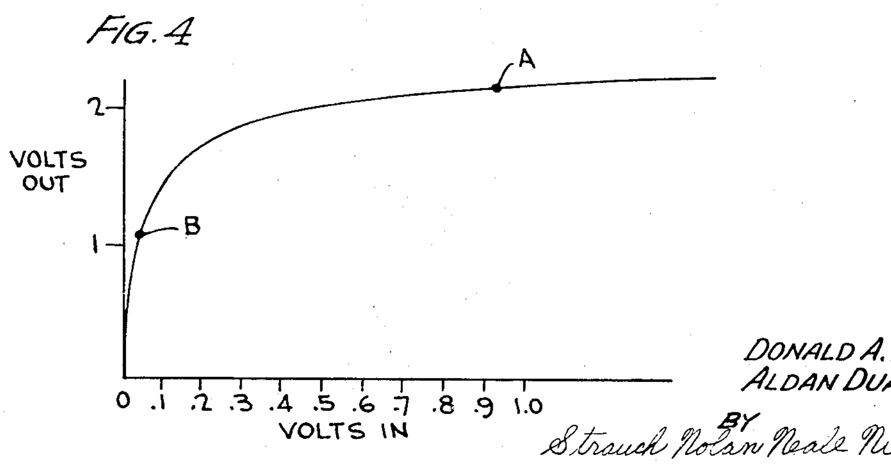
Figure 5:
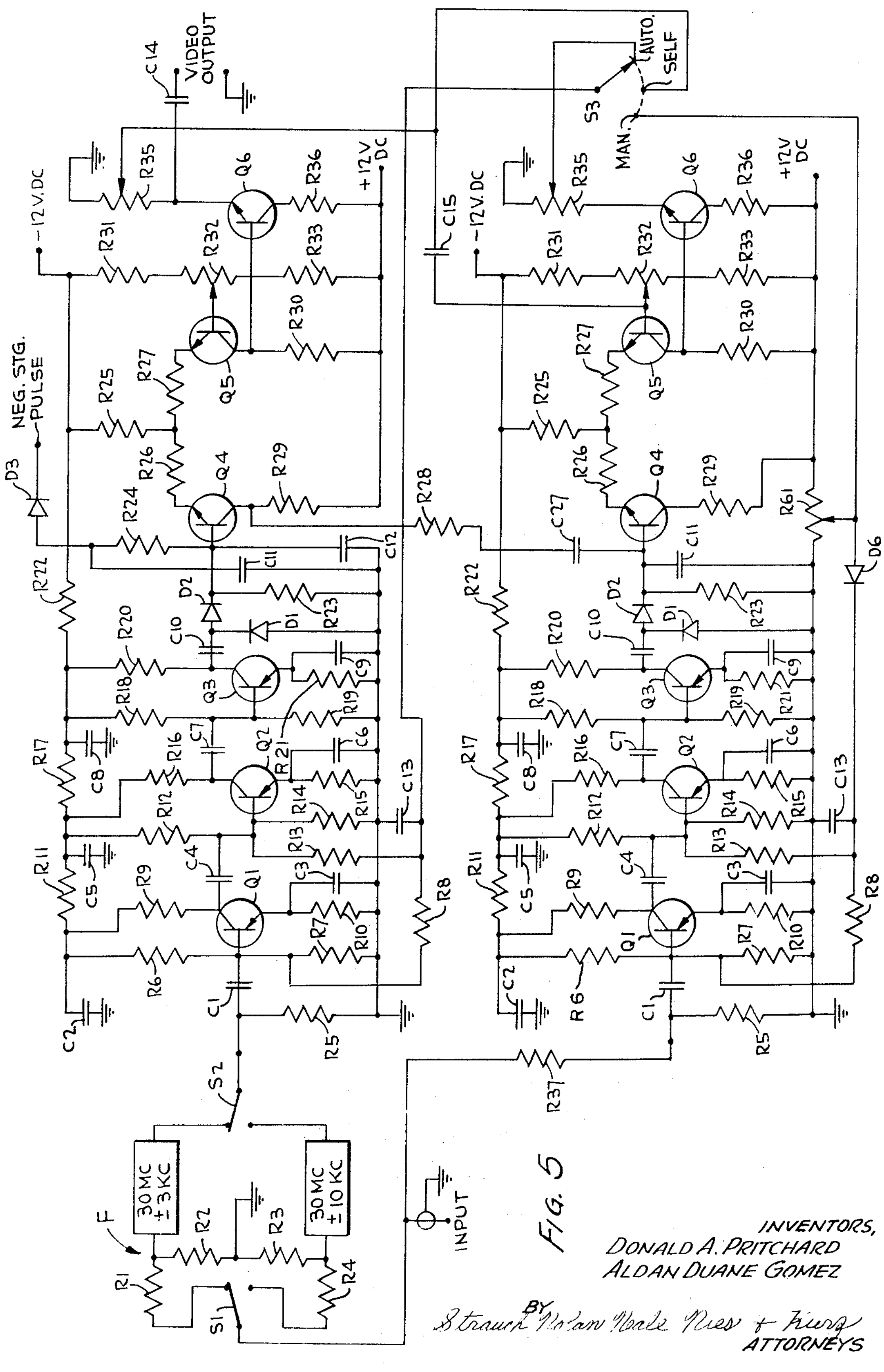

The invention will be better understood and other features and objects thereof will become more readily apparent when reference is given to the following detailed description, such description making reference to the appended drawings, wherein:

FIG. 1*a* is a functional block diagram of an illustrative linear amplifier arrangement which is responsive only to a narrow band width of those frequency components comprising a signal applied to the input thereof;

FIG. 1*b* is a functional block diagram of an illustrative amplifier arrangement operable to have a logarithmic compression gain, such amplifier arrangement being also responsive only to a relatively narrow band width of those frequency components comprising a signal applied to the input thereof;

FIG. 1*c* is a functional block diagram of a dual-channel, logarithmic compression amplifier arrangement constructed in accordance with the subject invention, the amplifier arrangement being responsive to both a relatively wide band width and a relatively narrow band width of those frequency components comprising a signal applied to the input thereof, the amplifier arrangement having a substantially logarithmic gain;

FIG. 2 depicts the frequency components and amplitudes thereof comprising a typical input signal applied to the amplifier arrangements of FIGS. 1*a*, 1*b* and 1*c*, the input signal occuring at some instantaneous point in time;

FIG. 3*a* depicts a typical, instantaneous response of the linear amplifier arrangement of FIG. 1*a* when the signal of FIG. 2 is applied at the input thereof;

FIG. 3*b* depicts a typical, instantaneous response of the logarithmic amplifier arrangement of FIG. 1*b* when the signal of FIG. 2 is applied at the input thereof;

FIG. 3*c* depicts a typical, instantaneous response of the inventive dual-channel logarithmic amplifier arrangement of FIG. 1*c* when the signal of FIG. 2 is applied at the input thereof;

FIG. 4 depicts an illustrative input gain curve of a logarithmic amplifier; and, fig. 5 is a detailed schematic circuit diagram of a preferred embodiment of the inventive dual-channel logarithmic amplifier arrangement of FIG. 1*c*.

Turning now to the drawings, and particularly to FIG. 2 thereof, a graphical representation of a typical input signal is depicted, frequency being plotted as the abscissa, magnitude or amplitude being plotted as the ordinate. This input signal is illustrative of that which may be obtained, for example, with a "continuous transmission" FM sonar system, and represents the frequency components present as well as the amplitude thereof at some instantaneous point in time. The frequency components comprising the input signal may be derived, for example, by heterodyning a carrier signal of high frequency with a lower frequency information signal, the graphical representation depicting, for example, those frequency components included in a single side band of the ensuing modulated carrier at an instantaneous point in time.

Instantaneous desired or selected frequency components representing specific sonar target information are depicted as occurring at points $f_1$ and $f_2$ closely approaching the relatively narrow band width $\Delta f_{narrow}$ centered around a center frequency $f_c$ of the input signal. Frequency components $f_1$ and $f_2$ may, for example, represent information about the conning tower of a monitored submarine target. Frequency components $f_1$ and $f_2$ may occur adjacent a plurality of additional frequency components $f$ of relatively high magnitude, the additional frequency components $f$ of relatively high magnitude occurring throughout a relatively wide band width $\Delta f_{wide}$ of the input signal. Frequency components $f$ may, for example, represent high level, wide band noise adjacent the desired or selected frequency components of interest and may be caused by the hull of a monitored submarine target. The magnitude of the high level, wide band noise $f$ immediately adjacent the desired or selected frequency components of interest $f_1$ and $f_2$ is illustrative shown as having an amplitude of 1 volt, the added magnitude of the selected frequency components $f_1$ and $f_2$ of interest raising the total magnitude of the input signal at the selected frequencies illustratively to 1.1 bolts. The significance of these illustrative magnitudes will become apparent hereinbelow.

In FIG. 1*a*, a functional block diagram of a linear amplifier arrangement is depicted, the linear amplifier arrangement being responsive to only a relatively narrow band width, $\Delta f_{narrow}$, for example, of those frequency components comprising the input signal of FIG. 2 by virtue of the band pass filter shown. The gain of the linear amplifier arrangement of FIG. 1*a* can be controlled by suitable adjustment of the feedback voltage V. For purposes of illustration, it is to be assumed that the linear amplifier arrangement of FIG. 1*a* will amplify an input signal having a magnitude of 1.0 volt, for example, in a fashion such that the output thereof would have a magnitude of 2 volts, any input signal greater than 1.0 volt causing saturation and overloading of the amplifier.

As will be readily apparent, if the input signal of FIG. 2 is applied to the linear amplifier arrangement of FIG. 1*a*, the linear amplifier will attempt to respond to the frequency components within the $\Delta f_{narrow}$ band width including in sequence the desired or selected frequency components $f_1$ and $f_2$. However, the characteristics and information of the desired or selected frequency components $f_1$ and $f_2$ will be lost since the linear amplifier arrangement, straining to amplify and detect small level signals, will be saturated or overloaded due to the high level, wide band noise adjacent these desired frequency components. Accordingly, the output signal of the linear amplifier arrangement of FIG. 1*a* when an input signal corresponding to that shown in FIG. 2 is applied thereto, is represented in FIG. 3*a* wherein it is apparent that the characteristics of the desired or selected frequency components $f_1$ and $f_2$ are lost in the presence of the amplified, high level wide band noise $f$.

The illustrative logarithmic amplifier arrangement of FIG. 1*b* can be assumed to be similar in construction to the linear amplifier arrangement of FIG. 1*a* with the exception that the input gain thereof follows a substantially logarithmic curve such as depicted in FIG. 4 wherein the amplification gain for higher level input signals is reduced below the corresponding gain for lower level input signals. It is again assumed that the logarithmic amplifier of FIG. 1*b* is scaled such that it may overload or saturate when an input signal greater than approximately 1.0 volt is applied thereto. When the input signal of FIG. 2 is applied to the logarithmic amplifier arrangement of FIG. 1*b*, the logarithmic amplifier will respond only to those frequency components within the relatively narrow band width $\Delta f_{narrow}$ due to the band pass filter shown. Yet, because of the magnitude of the wide band noise $f$ adjacent the desired or selected frequency components $f_1$ and $f_2$ and the high level of $f_1$ and $f_2$, the gain change of the logarithmic amplifier arrangement will be small and the amplifier arrangement will be operating near the saturation level. Thus, the information content of frequency components $f_1$ and $f_2$ will again be lost. A typical output wave form derived from the logarithmic amplifier of FIG. 1*b* when the signal of FIG. 2 is applied thereto, is shown in FIG. 3*b* and, as is apparent, the desired or selected frequency components $f_1$ and $f_2$ are less clearly ascertainable in the presence of high level, wide band noise $f$.

A functional block diagram of the dual-channel logarithmic amplifier arrangement of the subject invention is depicted in FIG. 1*c*. The inventive amplifier arrangement is seen to comprise a first amplifier means connected to a signal input through a band pass filter arrangement which will pass only those frequency components of the input signal of FIG. 2 found within the relatively narrow band width $\Delta f_{narrow}$, including, of course, the desired or selected frequency components $f_1$ and $f_2$ of interest. A second amplifier means is connected directly to the signal input by-passing the filter arrangement. The second amplifier means accordingly is responsive to a wider band width of frequency components and can substantially react to the wide band $\Delta f_{wide}$ spectral content of the input signal including the high level, wide band noise adjacent the desired frequency components $f_1$ and $f_2$ of interest.

Negative feedback is depicted as being fed from the output of the second or wide band amplifier means to the first or narrow band amplifier means to reduce the input gain of the first or narrow band amplifier means. Additional feedback schematically depicted as being capacitive in nature, can, if desired, be provided between the narrow band or first amplifier means and the wide band or second amplifier means so as to effect even greater control and stability of the inventive amplifier arrangement.

Assuming now, that the input signal of FIG. 2 is applied to the input of the amplification arrangement of FIG. 1*c*, the following novel operation will take place. The first or narrow band amplifier means would respond only to those frequency components of the input signal within the relatively narrow band width $\Delta f_{narrow}$ as is determined by the filter arrangement. However, as has been explained with reference to the amplification arrangements of both FIG. 1*a* and FIG. 1*b*, the first or narrow band amplifier means would essentially become substantially saturated or overloaded in the presence of the wide band, high level noise $f$, even though the first or narrow band amplifier means may be constructed to have a logarithmic gain such as shown in FIG. 4. Such substantial saturation would occur since the magnitude of the input signal caused by the high level, wide band noise $f$ is of an amplitude substantially greater than 1 volt around the desired or selected frequency components of interest. As is apparent from the curve of FIG. 4, the narrow band logarithmic amplifier means would be operating at point A, for example, that is, at a point close if not into saturation and would have a relatively small change in gain. Thus, the narrow band or first amplifier means, by itself, would also be unable to suitably detect and amplify the desired or selected frequency components $f_1$ and $f_2$ of the input signal due to the adjacent high level noise and the information contained within these desired or selected frequency components would accordingly be lost.

To overcome this drawback, however, the second or wide band amplifier means, such wide band amplifier means also preferably being constructed to effect a logarithmic gain, is provided to be responsive to a relatively wide band of those frequency components comprising the input signal of FIG. 2. Accordingly, the wide band amplifier means is not limited in response to only those frequency components found within the relatively narrow band $\Delta f_{narrow}$ of the input signal as is the first or narrow band amplifier means by virtue of the filter arrangement connected thereto. The second or wide band amplifier means is designed to react to those frequency components substantially within a large portion of the $\Delta f_{wide}$ band width of the input signal as depicted in FIG. 2. Therefore, the effect of the high level, wide band noise $f$ adjacent the desired or selected frequencies of interest $f_1$ and $f_2$ can be taken into account by the wide band amplifier means and compensated for by suitable feedback control over the input gain of the narrow band or first amplifier means.

Thus, the wide band or second amplifier means of the subject invention provides, at the output thereof, a signal composed of a plurality of frequency components corresponding to the presence of the high level noise $f$ throughout the relatively wide band $\Delta f_{wide}$. At the same time, the first or narrow band amplifier means responds only to those frequency components within the relatively narrow band $\Delta f_{narrow}$, including the desired or selected frequency components $f_1$ and $f_2$. Since negative feedback is provided between the output of the second or wide band amplifier means and the input of the first or narrow band amplifier means, the input gain of the first or narrow band amplifier means is automatically reduced and controlled by the output present at the second or wide band amplifier means from the high level, wide band noise $f$ adjacent the desired frequency components of interest $f_1$ and $f_2$.

Turning again to the curve of FIG. 4, the output of the relatively wide band or second amplifier means would serve to reduce the input gain of the first or relatively narrow band amplifier means from point A to point B along the input gain curve of FIG. 4 whenever the high level noise $f$ is present as shown in FIG. 2. Since the input gain of the first or narrow band amplifier means is automatically reduced in accordance with the magnitude of the wide band, high level noise $f$ adjacent the desired or selected frequency components $f_1$ and $f_2$, saturation is avoided and it will be apparent that the first or narrow band amplifier means can now readily respond to the selected frequency components $f_1$ and $f_2$ within the relatively narrow band $\Delta f_{narrow}$ of the input signal. An illustrative output response of the inventive dual-channel logarithmic amplifier arrangement is depicted in FIG. 3c, wherein it is seen that, because the input gain of the narrow band or first amplifier means has been reduced in the presence of the high level, wide band noise signal adjacent the desired frequency components of interest, such desired frequency components $f_1$ and $f_2$ are easily ascertainable at the output as shown, and thus the information content therein will not be lost and can be utilized.

It is to be noted that each of the amplifier arrangements of FIG. 1a, 1b and 1c are seen to desirably include a schematically illustrated demodulator section therein. The purpose of such a demodulator section should be apparent, since it was assumed that the input signal of FIG. 2 could comprise one side band of a modulated high frequency carrier. Accordingly, the demodulator section of the amplifier arrangements of FIGS. 1a, 1b and 1c would serve to demodulate the carrier and detect the modulating signal frequencies thereon. Thus, the actual output signals from all of the above amplifier arrangements would be reduced in frequency so as to comprise a suitable video output signal for subsequent display.

With the above general description of the inventive principles in mind, attention is now directed to FIG. 5, wherein a detailed circuit schematic of a preferred embodiment of the inventive dual-channel logarithmic amplifier arrangement of FIG. 1c is depicted. An input signal similar to that typically illustrated in FIG. 2 would be applied to the input terminal of the amplifier arrangement and an output signal, preferably utilized to drive video equipment, is taken from the video output terminal of the arrangement through a coupling capacitor C14. The general configuration of this preferred inventive embodiment follows the block diagram depicted in FIG. 1c, wherein the upper amplifier of the figure, by virtue of the filter arrangement F, will respond only to a relatively narrow band of frequency components of the plurality of frequency components comprising the input signal. The lower amplifier of the figure, although identical in most respects with the upper amplifier, is connected directly to the input terminal and thus by-passes the filter arrangement F. Accordingly, the lower amplifier will respond to a relatively wide band of frequency components of the plurality of frequency components comprising the input signal, the response of this amplifier being limited only by its inherent design characteristics. A negative, logarithmic feedback is provided from the output of the lower amplifier taken at variable resistor R35, through a switching mechanism S3, the construction of which will be discussed more fully hereinbelow, to the input stages of the upper amplifier through decoupling capacitor C13 and resistors R8 and R13 therein. As is apparent, the output from the lower or wide band amplifier is responsive to the presence of high level wide band noise adjacent desired frequency components of interest within the input signal and serves to reduce the input gain of the upper or narrow band amplifier such that the upper or narrow band amplifier can effectively detect and amplify those desired or selected frequency components and provide an informative output signal at the video output terminals thereof, as described above.

The filter arrangement generally designated F preferably comprises two band pass crystal filters operating around an illustrative center frequency of 30 MC and having pass bands of ±3KC and ±10KC, respectively. Actuation of switches S1 and S2 serves to couple the input signal and the upper amplifier to either one of the crystal filters. The input signal is accordingly tapped from the voltage dividers comprising resistors R1 and R2 or R3 and R4. Each of the crystal filters serves to pass only a relatively narrow band of the input signal frequency components including the desired or selected frequency components of interest. Switching between either one of the filters merely effects a higher or lower resolution.

Both the upper or narrow band amplifier and the lower or wide band amplifier are seen to include a plurality of stages. Specifically, two intermediate-frequency amplification stages are provided by the transistor components Q1 and Q2, respectively. A demodulator stage serving to demodulate the amplified intermediate-frequency signal and thus detect the modulating frequency thereof is provide by transistor Q3 in conjunction with a diode detector consisting of diodes D1, D2 and the parallel resistor-capacitor combination R23–C12. The detected signal is then amplified through a differential amplifier comprising transistors Q4 and Q5, the output of which is again amplified by transistor Q6.

As will be apparent from an inspection of the circuit schematic of FIG. 5, the first intermediate-frequency amplification stage of either amplifier comprises a transistor Q1, biasing elements for transistor Q1 comprising resistors R6, R7, R9 and R10. A capacitive shunt comprising capacitor C3 is placed in parallel with resistor R10. The input to the first intermediate-frequency amplification stage of either amplifier is applied across resistor R5 through a coupling capacitor C1. Capacitor C2 is connected between one terminal of resistor R6 and ground, as shown.

The second intermediate-frequency amplification stage of both the upper and lower amplifiers is provided by the transistor Q2, the second amplification stage being similar in construction to the first amplification stage above-discussed. Specifically, biasing resistors R12, R14, R16, and R15 are provided, with a shunting capacitor C6 being connected across resistor R15. Additionally, capacitor C5 is connected as shown. The amplified signal from the first amplification stage is coupled to the second amplification stage through a coupling capacitor C4.

In the intermediate-frequency amplification stages in the upper and lower amplifiers advantage is taken of the well-known operating characteristics of PNP transistors at low collector current levels to provide logarithmic amplification of the signals transmitted to these stages. MOre particularly, at the operating levels resulting from input signals of the magnitudes described above (on the order of 1 volt) a change in positive bias voltage (derived from the rectified input signals) can change the small signal gain of each of the two transistors Q1 and Q2 over a 10:1 range and the gain of the transistor pair over a 100:1 range since they are connected in series. The result is that signals encompassing a 40dB range can be compressed into 6dB so that signals entering the amplifier section at 10 millivolts will be amplified to 1 volt while those entering at 1 volt will produce a DC output of 2 volts.

The amplified intermediate-frequency signal from the second intermediate-frequency amplification stage is applied through coupling capacitor C7 to the input of a demodulator or detector stage comprising transistor Q3 and the associated diode detector construction. Biasing potential for transistor Q3 is similarly provided by a resistive arrangement comprising resistors R18 through R21, with a shunting capacitor C9 being placed across resistor R21. The amplified signal is tapped from the junction between resistor R20 and the collector of transistor Q3 through a capacitor C10 and is detected or demodulated by diodes D1 and D2 in conjunction with the parallel circuit branch consisting of resistor R23 and capacitor C12. Capacitor C11 provides a bypass for transients in the signal.

The detected signal is then amplified through a differential amplifier comprising transistors Q4 and Q5, the biasing or operating level of which is determined by resistors R25, R26, R29, R27, and R30. Particularly, the operating potential of transistor Q5 of the differential amplifier is determined by the setting of potentiometer R32 which forms a part of a voltage divider consisting of resistors R31, R32, and R33, connected at one end thereof to a negative 12-volt DC potential, and, at the other end thereof, to a positive 12-volt DC potential. As is apparent, the operating potential for the entire amplification arrangement is derived between the top conductor of each amplifier through various voltage dropping resistors R11, R17, and R22 (Capacitor C8 co-operates with resistor R22 to filter the 12-volt power supply) and the lower, common conductor of all amplification stages. The output from the differential amplifier is tapped across resistor R30 and is fed to the base of a final amplification stage comprising transistor Q6, the operating or biasing potential of which is determined by resistors R35 and R36.

As mentioned, the above-discussed components are common to both the upper and lower amplifier arrangements. Certain differences between the two amplifiers do exist, however. For one, the common conductor return path of the first and second intermediate-frequency amplification stages of the upper amplifier as well as the demodulator section thereof is preferably coupled with a non-illustrated source of negative starting or blanking pulses through the series circuit branch comprising capacitor C12, resistor R24, and diode D3. Also, in the lower, wide band amplifier, capacitor C11 is employed for additional filtering after demodulation rather than as a bypass for transients as it is in the narrow band amplifier. Additionally, positive feedback is provided, if desired, between the upper and lower amplifiers by virtue of the series circuit branch consisting of resistor R28 aNd capacitor C27 connected between the junction of the collector of transistor Q4 with resistor R29 of the upper amplifier and the base electrode of transistor Q4 of the lower amplifier. Additional positive feedback may also be provided between the upper and lower amplifiers and may be effected by the output from the wiper of potentiometer or resistor R35 in the upper amplifier, through capacitor C15, to the base electrode of transistor Q5 in the differential amplification stage of the lower amplifier. The gain between the two amplifiers is determined by the value of resistor R37. The actual usable video output signal of the entire amplification arrangement is taken from the emitter of transistor Q6 through the coupling capacitor C14 as shown.

The negative, logarithmic feedback of the upper amplifier discussed above can be adjusted and, in fact, selected through operation of a selector switch S3 which is seen to preferably comprise a "manual," a "self," and an "automatic" operational position. If selector switch S3 is placed into the "self" mode of operation, then a direct, negative logarithmic feedback is provided from the output of the upper or narrow band amplifier to the input thereof, and, accordingly, the upper amplifier would operate in a mode similar to that described with respect to the arrangement of FIG. 1b of the drawing. Specifically, the output of the upper or narrow band amplifier would be tapped from the variable tap on resistor R35 thereof and would be fed through the selector switch S3 to the "self" terminal, and to the first and second intermediate-frequency amplification stages comprising transistors Q1 and Q2 through coupling capacitor C13 and resistors R8 and R13, respectively. In this mode of operation, the magnitude of the output signal tapped across resistor R35 of the upper amplifier would serve to reduce the input gain of the first and second amplification stages of the upper or narrow band amplifier.

If the selector switch S3 is placed into the "manual" mode of operation, then a constant potential negative feedback will be effected upon the first and second intermediate-frequency amplification stages of the upper amplifier. Specifically, it is to be noted that, in the lower amplifier, a variable potential can be tapped from the positive 12-volt DC source by virtue of the variable tap arrangement of resistor R61 and blocking diode D6. This DC potential would be continually applied to the "-manual" terminal of selector switch S3 and thus be applied to the first and second intermediate-frequency amplification stages of the upper amplifier. In this mode of operation, the amplification arrangement would function in a manner similar to that described with respect to the arrangement depicted in FIG. 1*a*. It is to be understood, however, that operation of the inventive amplification arrangement in either the "manual" or the "self" mode as discussed, is desirable primarily from a testing standpoint.

When the selector switch S3 is placed into the "automatic" mode, however, operation of the inventive amplification arrangement in the manner discussed with respect to the arrangement in FIG. 1*c* is effected. Specifically, when switch S3 is in the "automatic" mode as is illustrated in FIG. 5, it is apparent that the output of the lower or wide band amplifier as taken from the variable tap on resistor R35 is applied directly to the input of the first and second intermediate amplification stages of the upper or narrow band amplifier through the coupling capacitor C13 and resistors R8 and R13, respectively. Thus, it should be apparent that the amplified output obtained from the lower wide band amplifier, which output reflects the magnitude of high level, wide band noise adjacent selected frequency components of interest, is utilized to automatically reduce the input gain of the upper or narrow band amplifier such that the desired or selected frequency components of interest will be readily apparent at the video output of the upper or narrow band amplifier in the manner previously described.

As should now be apparent, the objects initially set forth at the outset of this specification have been successfully achieved. Accordingly,

We claim:

1. A dual-channel amplifier arrangement comprising first and second amplifier means having respective inputs and outputs and at least one of said first and second amplifier means comprising a logarithmic amplifier; band pass filter means; means connecting the input of said second amplifier means to a source of signals around said band pass filter means; means connecting the input of said first amplifier means to the source of signals through said band pass filter means; and feedback means coupled between the output of said second amplifier means and the input of said first amplifier means to apply the output of said second amplifier means to the input of said first amplifier means for reducing the input gain to said first amplifier means when there are high magnitude components in said wide band but outside of said narrow band at the same time that there are components in said narrow band to thereby prevent said first amplifier means from being saturated by said high magnitude components, whereby said first amplifier means is made readily responsive to the selected frequency components of said input signal despite the simultaneous existence of said high magnitude components.

2. An amplifier arrangement as defined in claim 1, wherein said first and second amplifier means each comprise a plurality of intermediate-frequency amplification stages connected to a detector means.

3. An amplifier arrangement defined in claim 2, wherein each said first and second amplifier means further comprise a differential amplification stage connected between said detector means and said respective output.

4. Apparatus for detecting and amplifying selected components of an input signal comprising a source of a frequency modulated input signal which includes a carrier signal, information containing components in a narrow band width, and components with frequencies adjacent those of the information containing components of the input signal; filter means for receiving and passing the narrow band width portion of said input signal; a first amplifier means comprising a first amplifier section for amplifying the narrow band width portion of said input signal which includes at least one stage capable of logarithmically amplifying said input signal, a section for demodulating said amplified signal to remove the carrier therefrom, and a second amplifier section for amplifying the demodulated signal; means for conducting the amplified, demodulated signal to a user unit; and means for reducing the input gain to the first amplifier section of the first amplifier means when the input signal includes high magnitude components with frequencies adjacent those embraced in said narrow band width to thereby prevent said amplifier section from being saturated or overloaded by said high magnitude components, whereby said amplifier section is made readily responsive to components of the input signal in said narrow band width despite the presence of said high magnitude components in said signal, said last-mentioned means comprising a second amplifier means having an input connected to said input signal source around said filter means, a first amplifier section for amplifying the input signal which includes at least one stage capable of logarithmically amplifying said input signal, a demodulator section for removing the carrier signal from the amplified input signal, a second amplifier section for amplifying the demodulated signal, and means for applying the amplified, demodulated signal produced by the second amplifier section of said amplifier means to the input of said first amplifier section of the first amplifier means.

5. The apparatus of claim 4, wherein the second amplifier section of each of said amplifying means includes a differential amplifier.

6. The apparatus of claim 4, together with means for varying the overall level of the amplified, modulated signal from the second amplifying means to thereby alter the extent to which said signal alters the gain to the first amplifier section of said first signal amplifying means.

7. Apparatus for detecting and amplifying selected components of an input signal comprising a source of a frequency modulated input signal which includes a carrier signal, information containing components in a narrow band width, and components with frequencies adjacent those of the information containing components of the input signal; filter means for receiving and passing the narrow band width portion of said input signal; a first amplifier means comprising a first amplifier section for amplifying the narrow band width portion of said input signal, a section for demodulating said amplified signal to remove the carrier therefrom, and a second amplifier section for amplifying the demodulated signal; means for conducting the amplified, demodulated signal to a user unit; means for reducing the input gain to the first amplifier section of the first amplifier means when the input signal includes high magnitude components with frequencies adjacent those embraced in said narrow band width to thereby prevent said amplifier section from being saturated or overloaded by said high magnitude components, whereby said amplifier section is made readily responsive to components of the input signal in said narrow band width despite the presence of said high magnitude components in said signal, said last-mentioned means comprising a second amplifier means having an input connected to said input signal source around said filter means, a first amplifier section for amplifying the input signal, a demodulator section for removing the carrier signal from the amplified input signal, a second amplifier section for amplifying the demodulated signal, and means for applying the amplified, demodulated signal produced by the second amplifier section of said amplifier means to the input of said first amplifier section of the first amplifier means; and circuit means so connected between said first and second amplifying means as to provide positive feedback from said second amplifying means to said first amplifying means and thereby increase the stability of said first amplifier means.

8. Apparatus for detecting and amplifying selected components of an input signal comprising a source of a frequency modulated input signal which includes a carrier signal, information containing components in a narrow band width, and components with frequencies adjacent those of the information containing components of the input signal; filter means for receiving and passing the narrow band width portion of said input signal; a first amplifier means comprising a first amplifier section for amplifying the narrow band width portion of said input signal, a section for demodulating said amplified signal to remove the carrier therefrom, and a second amplifier section for amplifying the demodulated signal; means for conducting the amplified, demodulated signal to a user unit; means for reducing the input gain to the first amplifier section of the first amplifier means when the input signal includes high magnitude components with frequencies adjacent those embraced in said narrow band width to thereby prevent said amplifier section from being saturated or overloaded by said high magnitude components, whereby said amplifier section is made readily responsive to components of the input signal in said narrow band width despite the presence of said high magnitude components in said signal, said last-mentioned means comprising a second amplifier means having an input connected to said input signal source around said filter means, a first amplifier section for amplifying the input signal, a demodulator section for removing the carrier signal from the amplified input signal, a second amplifier section for amplifying the demodulated signal, and means for applying the amplified, demodulated signal produced by the second amplifier section of said amplifier means to the input of said first amplifier section of the first amplifier means; and means for providing negative feedback from the output side of the second amplifier section in said first amplifying means to the input side of the first amplifier section therein.

9. An apparatus for detecting and amplifying selected frequency components of an input signal comprising a plurality of frequency components, said apparatus comprising means including first amplifier means responsive only to a relatively narrow input signal frequency band containing the selected frequency components of the input signal for amplifying the same and producing an output signal, the means including said first amplifier means further comprising filter means adapted to be coupled with the input signal for passing said relatively narrow band of frequency components, said first amplifier means being connected to the output of said filter means and said filter means comprising a plurality of band pass filter elements operating about the same center frequency and means for selectively coupling said first amplifier means to each of said plurality of band pass filter elements; second amplifier means responsive to a relatively wide band of said frequency components of the input signal for amplifying the same and producing an output signal, said relatively wide band encompassing said relatively narrow band; and means providing a feed back connection between the output of said second amplifier means and the input of said first amplifier means for reducing the input gain to said first amplifier means when there are high magnitude frequency components in said wide band but outside of said narrow band at the same time that there are components in said narrow band to thereby prevent said first amplifier means from being saturated by said high magnitude components, whereby said first amplifier means is made readily responsive to the selected frequency components of said input signal despite the simultaneous existence of said high magnitude components.

10. The apparatus defined in claim 9, wherein the feedback provided by said feedback providing means is a negative feedback.

11. An apparatus for detecting and amplifying selected frequency components of an input signal comprising a plurality of frequency components, said apparatus comprising means including first amplifier means responsive only to a relatively narrow input signal frequency band containing the selected frequency components of the input signal for amplifying the same and producing an output signal; second amplifier means responsive to a relatively wide band of said frequency components of the input signal for amplifying the same and producing an output signal, said relatively wide band encompassing said relatively narrow band; and means providing a feed back connection between the output of said second amplifier means and the input of said first amplifier means for reducing the input gain to said first amplifier means when there are high magnitude frequency components in said wide band but outside of said narrow band at the same time that there are components in said narrow band to thereby prevent said first amplifier means from being saturated by said high magnitude components, whereby said first amplifier means is made readily responsive to the selected frequency components of said input signal despite the simultaneous existence of said high magnitude components, at least one of said first and second amplifier means comprising a logarithmic amplifier device.

12. An apparatus as defined in claim 11, wherein both said first and second amplifier means include detector means for demodulating signals amplified therein.

13. The apparatus defined in claim 12, further including selector means for selectively disconnecting said first amplifier means from said second amplifier means, said selector means effecting a negative feedback connection from the output of said first amplifier means to the input thereof.

14. An apparatus as defined in claim 13, wherein both said feedback providing means from said second amplifier means to said first amplifier means and said negative feedback connection from the output of said first amplifier means to the input thereof are adjustable.

15. A dual-channel amplifier arrangement for producing amplified components of a signal in a narrow frequency band despite the existence of signal components of greater magnitude in frequency bands adjacent thereto comprising first and second amplifier means having respective inputs and outputs; band pass filter means, means connecting the input of said second amplifier means to a source of signals around said band pass filter means, whereby said second amplifier means will receive signal components having a wide range of frequencies; means connecting the input of said first amplifier means to the source of signals through said band pass filter means whereby said first filter means will receive only those signal components in the narrow frequency band; and means for preventing the first amplifier from being saturated when there are signal components of high magnitude in frequencies adjacent but outside of said narrow frequency band which comprises feed back means coupled between the output of said second amplifier means and the input of said first amplifier means, whereby said first amplifier means is made readily responsive to the selected frequency components of said input signal despite the simultaneous existence of said high magnitude components.

16. The dual channel amplifier arrangement of claim 15, wherein said first and second amplifier means have substantially the same center frequency.

17. The dual channel amplifier arrangement of claim 15, wherein said feed back means is constructed to produce a capacitive feed back between said second and first amplifier means.

18. The dual channel amplifier arrangement of claim 15, wherein said band pass filter means comprises a plurality of filter means of different band widths and means for connecting the input of said first amplifier means to said source of signals through different ones of said filter means to thereby change the width of the band of frequency components which can be transmitted to said first amplifier means.

19. The dual channel amplifier arrangement of claim 15, wherein said first and second amplifier means both include circuit components for logarithmically amplifying the input signals transmitted thereto.

20. The dual channel amplifier arrangement of claim 15, wherein said first amplifier means comprises a first amplifier section for amplifying the narrow band width portion of said input signal, a section for demodulating said amplified signal to remove the carrier therefrom, and a second amplifier section for amplifying the demodulated signals; wherein said second amplifier means comprises a first amplifier section for amplifying the input signal, a demodulator section for removing the carrier signal from the amplified input signal, and a second amplifier section for amplifying the demodulated signal; and wherein said feedback means comprises means for applying the amplified, demodulated signal produced by the second amplifier section of said amplifier means to the input of said first amplifier section of the first amplifier means.

* * * * *